US012665414B2

(12) United States Patent
Chen et al.

(10) Patent No.: US 12,665,414 B2
(45) Date of Patent: Jun. 23, 2026

(54) LATCH CURRENT LIMITER CIRCUIT FOR SPACECRAFT AND SPACECRAFT POWER SYSTEM USING THE SAME

(71) Applicant: TAIWAN SPACE AGENCY, Hsinchu City (TW)

(72) Inventors: Yu-Kai Chen, Huwei Township (TW); Chung-En Hsiao, Huwei Township (TW); Yu-Shan Tai, Huwei Township (TW)

(73) Assignee: TAIWAN SPACE AGENCY, Hsinchu City (TW)

( * ) Notice: Subject to any disclaimer, the term of this patent is extended or adjusted under 35 U.S.C. 154(b) by 0 days.

(21) Appl. No.: 18/908,112

(22) Filed: Oct. 7, 2024

(65) Prior Publication Data

US 2025/0125610 A1      Apr. 17, 2025

(30) Foreign Application Priority Data

Oct. 17, 2023    (TW) ................................. 112139662

(51) Int. Cl.
| | |
|---|---|
| *H02H 9/02* | (2006.01) |
| *B64G 1/42* | (2006.01) |
| *H02M 3/00* | (2006.01) |
| *H02M 3/335* | (2006.01) |
| *H03B 5/24* | (2006.01) |
| *H03K 19/20* | (2006.01) |

(52) U.S. Cl.
CPC ................. *H02H 9/02* (2013.01); *B64G 1/42* (2013.01); *H02M 3/01* (2021.05); *H02M 3/335* (2013.01); *H03B 5/24* (2013.01); *H03K 19/20* (2013.01)

(58) Field of Classification Search
CPC ....................................................... H02H 9/02
USPC ............................................................ 307/9.1
See application file for complete search history.

(56) References Cited

U.S. PATENT DOCUMENTS

| | | | | |
|---|---|---|---|---|
| 4,764,857 A * | 8/1988 | Konopka | ................ | H02M 1/36 |
| | | | | 323/901 |
| 2004/0109354 A1* | 6/2004 | Wang | ..................... | G11C 16/12 |
| | | | | 365/185.11 |
| 2019/0372397 A1* | 12/2019 | Brohlin | ................. | H02J 7/0071 |

* cited by examiner

*Primary Examiner* — Joseph Chang
(74) *Attorney, Agent, or Firm* — MUNCY, GEISSLER, OLDS & LOWE, P.C.

(57) ABSTRACT

The embodiment of the present invention relates to a latch current limiter (LCL) circuit for spacecraft and a spacecraft power system using the same. The LCL circuit are coupled between a power supply terminal and a power receiving terminal, wherein a semiconductor switch circuit is configured between the power supply terminal and the power receiving terminal. The semiconductor switch circuit includes a conduction mode, a cut-off mode and a resistance mode. Moreover, an LLC DC-to-DC converter is adopted for controlling the semiconductor switch circuit. When the current is greater than the over-current value, the LLC DC-to-DC converter changes its operational frequency to change the output voltage such that the semiconductor switch circuit is controlled to enter the resistance mode. After a preset period, when the current does not return the regular value, the LLC DC-to-DC converter controls the semiconductor switch circuit to enter the cut-off mode such that the power which supplies to the load is turned off.

20 Claims, 8 Drawing Sheets

EN2

$5*10^5$          $6*10^5$

LATCH CURRENT LIMITER CIRCUIT FOR SPACECRAFT AND SPACECRAFT POWER SYSTEM USING THE SAME

CROSS-REFERENCE TO RELATED APPLICATIONS

This application claims priority of No. 112139662 filed in Taiwan R.O.C. on Oct. 17, 2023 under 35 USC 119, the entire content of which is hereby incorporated by reference.

BACKGROUND OF THE INVENTION

Field of the Invention

The present invention relates to the technology of power electronic adapted for aerospace equipment, more particularly, the present invention relates to a latch current limiter circuit for a spacecraft and a spacecraft power system using the same.

Description of the Related Art

The latch current limiter circuit (LCL) is an important component widely used in aerospace equipment and other high-reliability electronic systems. Its main function is to quickly cut off the circuit when the current exceeds a specific threshold to prevent excessive current from damaging electronic components or causing safety issues such as fire. A latch current limiter circuit typically uses a current sensing component, such as a current detector or current sensing resistor, to monitor the current in the circuit. When the current exceeds a preset threshold, the latch current limiter circuit is triggered to cut off the circuit and stop the flow of current, thereby protecting components of the system from damage.

BRIEF SUMMARY OF THE INVENTION

An object of the present invention is to provide a latch current limiter circuit for spacecraft and a spacecraft power system using the same, to prevent the damage from overcurrent of load in aerospace equipment. Further the design in this embodiment limits the amount of current flowing through the load and shut the current down after a preset period, it can give the load, which has suffered a temporary fault, an opportunity to restart.

In view of this, the invention provides latch current limiter circuit for spacecraft. The latch current limiter circuit, adapted for spacecraft power system, includes an input terminal, an output terminal, a current sensing circuit, a transistor switch circuit and a transistor switch control circuit. The current sensing circuit is coupled between the input terminal and the output terminal, for outputting a current sense voltage according to the current flowing from the input terminal to the output terminal. The transistor switch circuit includes a first terminal, a second terminal and a control terminal, wherein the first terminal of the transistor switch circuit is coupled to the input terminal through a current sensing circuit, and the second terminal of the transistor switch circuit is coupled to the output terminal.

The invention further provides a spacecraft power system, for providing at least an operational power voltage of an aerospace equipment. The spacecraft power system includes a power supply unit and a latch current limiter circuit. The power supply unit includes a power output terminal for providing the operational power voltage. The latch current limiter circuit includes an input terminal, an output terminal, a current sensing circuit, a transistor switch circuit and a transistor switch control circuit. The current sensing circuit is coupled between the input terminal and the output terminal, for outputting a current sense voltage according to the current flowing from the input terminal to the output terminal. The transistor switch circuit includes a first terminal, a second terminal and a control terminal, wherein the first terminal of the transistor switch circuit is coupled to the input terminal through a current sensing circuit, and the second terminal of the transistor switch circuit is coupled to the output terminal.

The transistor switch control circuit includes a transformer, an LC resonant circuit, a rectifier filtering circuit, a switching circuit and a relaxation oscillator circuit. The transformer includes a primary side coil and a secondary side coil. The LC resonant circuit is coupled to the primary side coil of the transformer. The rectifier filtering circuit includes a first input terminal, a second input terminal, a first output terminal and a second output terminal, wherein the first input terminal of the rectifier filtering circuit is coupled to a first terminal of the secondary side coil, the second input terminal of the rectifier filtering circuit is coupled to a second terminal of the secondary side coil, the first output terminal of the rectifier filtering circuit is coupled to the control terminal of the transistor switch circuit, and the second output terminal of the rectifier filtering circuit is coupled to the second terminal of the transistor switch circuit. The switching circuit includes an input terminal and an output terminal, wherein the output terminal of the switching circuit is coupled to the LC resonant circuit. The relaxation oscillator circuit receives the current sense voltage, and outputs a clock signal to the input terminal of the switching circuit, for controlling the switching circuit, to control an output voltage of the transistor switch control circuit, such that an operation mode of the transistor switch circuit is controlled.

The relaxation oscillator circuit includes a variable-capacitance circuit for changing the capacitance value of the variable-capacitance circuit according to the current sense voltage. The relaxation oscillator circuit is for changing the clock signal output from the relaxation oscillator circuit according to the capacitance value of the variable-capacitance circuit. When the current flowing from the input terminal to the output terminal is greater than a preset value, the current sense voltage is changed so as to change the capacitance value of the variable-capacitance circuit, and a frequency of the clock signal is changed such that an operation of the transistor switch control circuit deviates from a resonance point with the highest gain, thereby reducing the output voltage of the transistor switch control circuit, causing the transistor switch circuit to operate in a resistance mode to limit the current from the input terminal to the output terminal.

In the latch current limiter circuit for spacecraft and the spacecraft power system using the same according to a preferred embodiment of the present invention, the relaxation oscillator circuit includes a first NAND gate and a Schmitt trigger circuit. The first NAND gate includes a first input terminal, a second input terminal and an output terminal, wherein the first input terminal of the first NAND gate receives an activate/deactivate signal, and the second input terminal of the first NAND gate is coupled to the variable-capacitance circuit. The Schmitt trigger circuit includes an input terminal and an output terminal, wherein the input terminal of the Schmitt trigger circuit is coupled to the output terminal of the first NAND gate, and the output terminal of the Schmitt trigger circuit outputs the clock signal. In a preferred embodiment, the variable-capacitance circuit includes a first resistor, a first capacitor, a block capacitor and a varactor. The first resistor includes a first terminal and a second terminal, wherein the first terminal of the first resistor is coupled to the output terminal of the first NAND gate, the second terminal of the first resistor is coupled to the second input terminal of the first NAND gate. The first capacitor includes a first terminal and a second terminal, wherein the first terminal of the first capacitor is coupled to the second input terminal of the first NAND gate, the second terminal of the first capacitor is coupled to the common voltage. The block capacitor includes a first terminal and a second terminal, wherein the first terminal of the block capacitor is coupled to the second input terminal of the first NAND gate. The varactor includes a first terminal and a second terminal, wherein the first terminal of the varactor is coupled to the second terminal of the block capacitor, and the second terminal of the varactor is coupled to the common voltage, wherein the first terminal of the varactor receives the current sense voltage to adjust a capacitance value of the varactor.

In the latch current limiter circuit for spacecraft and the spacecraft power system using the same according to a preferred embodiment of the present invention, the relaxation oscillator circuit further includes a timer circuit, a set-reset flip-flop, an inverter and an AND gate. The timer circuit includes an input terminal and an output terminal, wherein the input terminal of the timer circuit receives the current sense voltage, wherein a timing of the timer circuit starts, when the current sense voltage reaches a predetermined voltage, and a complete timing signal output by the timer circuit is enabled when the timer circuit starts timing a predetermined time. The set-reset flip-flop includes a reset input terminal, a set input terminal and a Q output terminal, wherein the reset input terminal of the set-reset flip-flop receives the complete timing signal from the output terminal of the timer circuit, and the Q output terminal of the set-reset flip-flop outputs a latch signal. The inverter includes an input terminal and an output terminal, wherein the input terminal of the inverter is coupled to the reset input terminal of the set-reset flip-flop, the output terminal of the inverter is coupled to the set input terminal of the set-reset flip-flop. The AND gate includes a first input terminal, a second input terminal and an output terminal, wherein the first input terminal of the AND gate is coupled to the Q output terminal of the set-reset flip-flop to receives the latch signal, the second input terminal of the AND gate receives a start-up signal, and the output terminal of the AND gate outputs the activate/deactivate signal.

In the latch current limiter circuit for spacecraft and the spacecraft power system using the same according to a preferred embodiment of the present invention, the latch current limiter circuit further includes a undervoltage lockout (UVLO) circuit. The UVLO circuit includes an input terminal and an output terminal, wherein the input terminal of the undervoltage lockout circuit is coupled to the input terminal of the latch current limiter circuit, the output terminal of the undervoltage lockout circuit is coupled to the reset input terminal of the set-reset flip-flop, wherein the undervoltage lockout circuit is for detecting a voltage of the input terminal of the latch current limiter circuit, wherein the undervoltage lockout circuit enable an UVLO signal when the voltage of the input terminal of the latch current limiter circuit is lower than an operational voltage.

In the latch current limiter circuit for spacecraft and the spacecraft power system using the same according to a preferred embodiment of the present invention, the timer circuit further includes a first comparator, a charge/discharge circuit and a second comparator. The first comparator includes a first input terminal, a second input terminal and an output terminal, wherein the first input terminal of the first comparator is coupled to the input terminal of the timer circuit to receive the current sense voltage, the second input terminal of the first comparator recoveries a first reference voltage. The charge/discharge circuit includes an input terminal and an output terminal, wherein the input terminal of the charge/discharge circuit is coupled to the output terminal of the first comparator. The second comparator includes a first input terminal, a second input terminal and an output terminal, wherein the first input terminal of the second comparator is coupled to the output terminal of the charge/discharge circuit, the second input terminal of the second comparator receives a second reference voltage, and the output terminal of the second comparator outputs the complete timing signal.

In the latch current limiter circuit for spacecraft and the spacecraft power system using the same according to a preferred embodiment of the present invention, the charge/discharge circuit further includes a first resistor, a second resistor and a second capacitor. The first resistor includes a first terminal and a second terminal, wherein the first terminal of the first resistor is coupled to the input terminal of the charge/discharge circuit. The second resistor includes a first terminal and a second terminal, wherein the first terminal of the second resistor is coupled to the second terminal of the first resistor, and the second terminal of the second resistor is coupled to the common voltage. The second capacitor includes a first terminal and a second terminal, wherein the first terminal of the second capacitor is coupled to the second terminal of the first resistor, and the second terminal of the second capacitor is coupled to the common voltage.

In the latch current limiter circuit for spacecraft and the spacecraft power system using the same according to a preferred embodiment of the present invention, the latch current limiter circuit further includes a start-up oscillator, for initially outputting the clock signal to control the switching circuit and start the transistor switch control circuit.

In the latch current limiter circuit for spacecraft and the spacecraft power system using the same according to a preferred embodiment of the present invention, the rectifier filtering circuit includes a first diode, a second diode, a third diode and a fourth diode. The first diode includes an anode terminal and a cathode terminal, wherein the anode terminal of the first diode is coupled to the first input terminal of the rectifier filtering circuit, the cathode terminal of the first diode is coupled to the first output terminal of the rectifier filtering circuit. The second diode includes an anode terminal and a cathode terminal, wherein the anode terminal of the second diode is coupled to the second input terminal of the rectifier filtering circuit, and the cathode terminal of the second diode is coupled to the first output terminal of the rectifier filtering circuit. The third diode includes an anode terminal and a cathode terminal, wherein the anode terminal of the third diode is coupled to the second output terminal of the rectifier filtering circuit, and the cathode terminal of the third diode is coupled to the first input terminal of the rectifier filtering circuit. The fourth diode includes an anode terminal and a cathode terminal, wherein the anode terminal of the fourth diode is coupled to the second output terminal of the rectifier filtering circuit, and the cathode terminal of the fourth diode is coupled to the second input terminal of the rectifier filtering circuit.

In the latch current limiter circuit for spacecraft and the spacecraft power system using the same according to a preferred embodiment of the present invention, the switching circuit includes a first transistor and a second transistor. The first transistor includes a base terminal, an emitter terminal and a collector terminal, wherein the base terminal of the first transistor is coupled to the input terminal of the switching circuit to receive the clock signal, the collector terminal of the first transistor receives a power voltage, and the emitter terminal of the first transistor is coupled to the output terminal of the switching circuit. The second transistor includes a base terminal, an emitter terminal and a collector terminal, wherein the base terminal of the second transistor receives the clock signal, the emitter terminal of the second transistor is coupled to the emitter terminal of the first transistor and the output terminal of the switching circuit, and the collector terminal of the second transistor is coupled to a common voltage.

In the latch current limiter circuit for spacecraft and the spacecraft power system using the same according to a preferred embodiment of the present invention, the LC resonant circuit further includes a resonant capacitor and a resonant inductor. The resonant capacitor includes a first terminal and a second terminal, wherein the first terminal of the resonant capacitor is coupled to the output terminal of the switching circuit. The resonant inductor includes a first terminal and a second terminal, wherein the first terminal of the resonant inductor is coupled to the second terminal of the resonant capacitor, and the second terminal of the resonant inductor is coupled to the primary side coil of the transformer.

The preferred embodiments of the present invention, within the spacecraft power system, incorporate a semiconductor switching circuit placed between the power supply terminal and power receiving terminal. Additionally, the control of the semiconductor switching circuit is achieved through a resonant-type power supply unit. In the event of an overcurrent, the operating frequency of the resonant-type power supply unit is deliberately shifted away from the resonance point. This deviation will result in semiconductor switching circuit transforming into a resistive mode, thereby limiting the excessive current flow. After a predetermined time, the semiconductor switching circuit is then deactivated. This approach provides an opportunity for temporarily faulted loads to be reactivated.

The above-mentioned and other objects, features and advantages of the present invention will become more apparent from the following detailed descriptions of preferred embodiments taken in conjunction with the accompanying drawings.

DETAILED DESCRIPTION OF THE INVENTION

Figure 1:
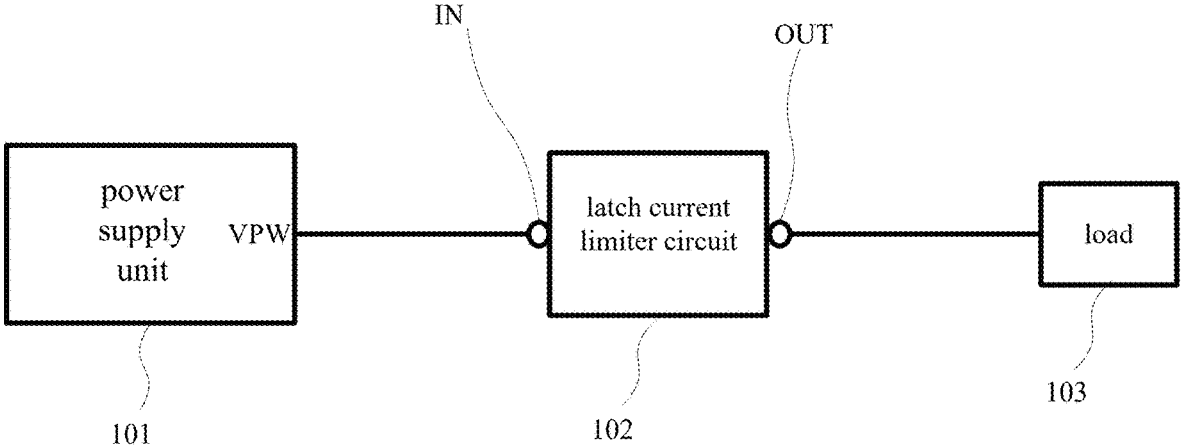
FIG. 1 illustrates a circuit block diagram depicting a spacecraft power system according to a preferred embodiment of the present invention.

The exemplary embodiments of the present invention, which are illustrated in the accompanying drawings, are provided. Wherever possible, the same reference numbers are used in the drawings and description to refer to the same or like parts. In addition, the practice of the exemplary embodiment is only one of the implementations of the design concept of the present invention, and thus, the present invention is not limit thereto.

FIG. 1 illustrates a circuit block diagram depicting a spacecraft power system according to a preferred embodiment of the present invention. Referring to FIG. 1, in this embodiment, the spacecraft power system is used to provide an operational power voltage to at least one load (aerospace equipment) 103, wherein the spacecraft power system includes a power supply unit 101 and a latch current limiter circuit 102. The power supply unit 101 includes a power output terminal VPW to provide an operational power voltage. The latch current limiter circuit 102 includes an input terminal IN and an output terminal OUT.

Figure 2:
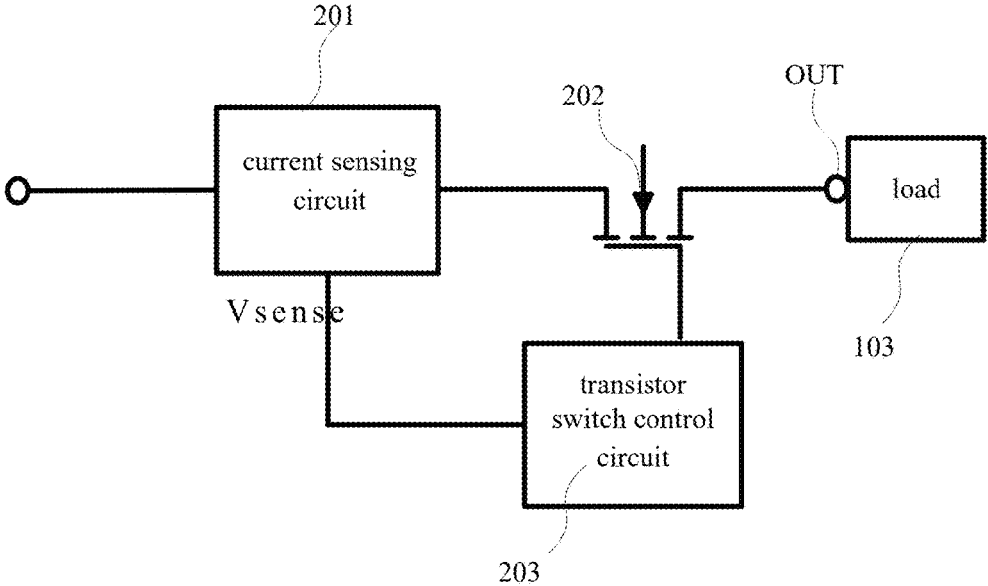
FIG. 2 illustrates a circuit block diagram depicting a latch current limiter circuit 102 according to a preferred embodiment of the present invention.

FIG. 2 illustrates a circuit block diagram depicting a latch current limiter circuit 102 according to a preferred embodiment of the present invention. Referring to FIG. 2, in this embodiment, the latch current limiter circuit 102 includes an input terminal IN, an output terminal OUT, a current sensing circuit 201, a transistor switch circuit 202 and a transistor switch control circuit 203. The current sensing circuit 201 is coupled between the input terminal IN of the latch current limiter circuit 102 and the output terminal OUT of the latch current limiter circuit 102 for outputting a current sense voltage Vsense according to the current from the input terminal IN of the latch current limiter circuit 102 to the output terminal OUT of the latch current limiter circuit 102. In this embodiment, the transistor switch circuit 202 is, for example, an N-type metal oxide semiconductor field effect transistor. The N-type metal oxide semiconductor field effect transistor includes a first source-drain electrode, a second source-drain electrode, and a gate terminal to respectively serve as the first terminal, the second terminal and the control terminal of the transistor switch circuit 202. The first terminal of the transistor switch circuit 202 is coupled to the input terminal IN of the latch current limiter circuit 102 through the current sensing circuit 201, and the second terminal of the transistor switch circuit 202 is coupled to the output terminal OUT of the latch current limiter circuit 102. The function of the latch current limiter circuit 102 is mainly to control the conduction state between the first terminal and the second terminal of the transistor switch circuit 202 based on the current sense voltage Vsense output by the current sensing circuit 201.

Figure 3:
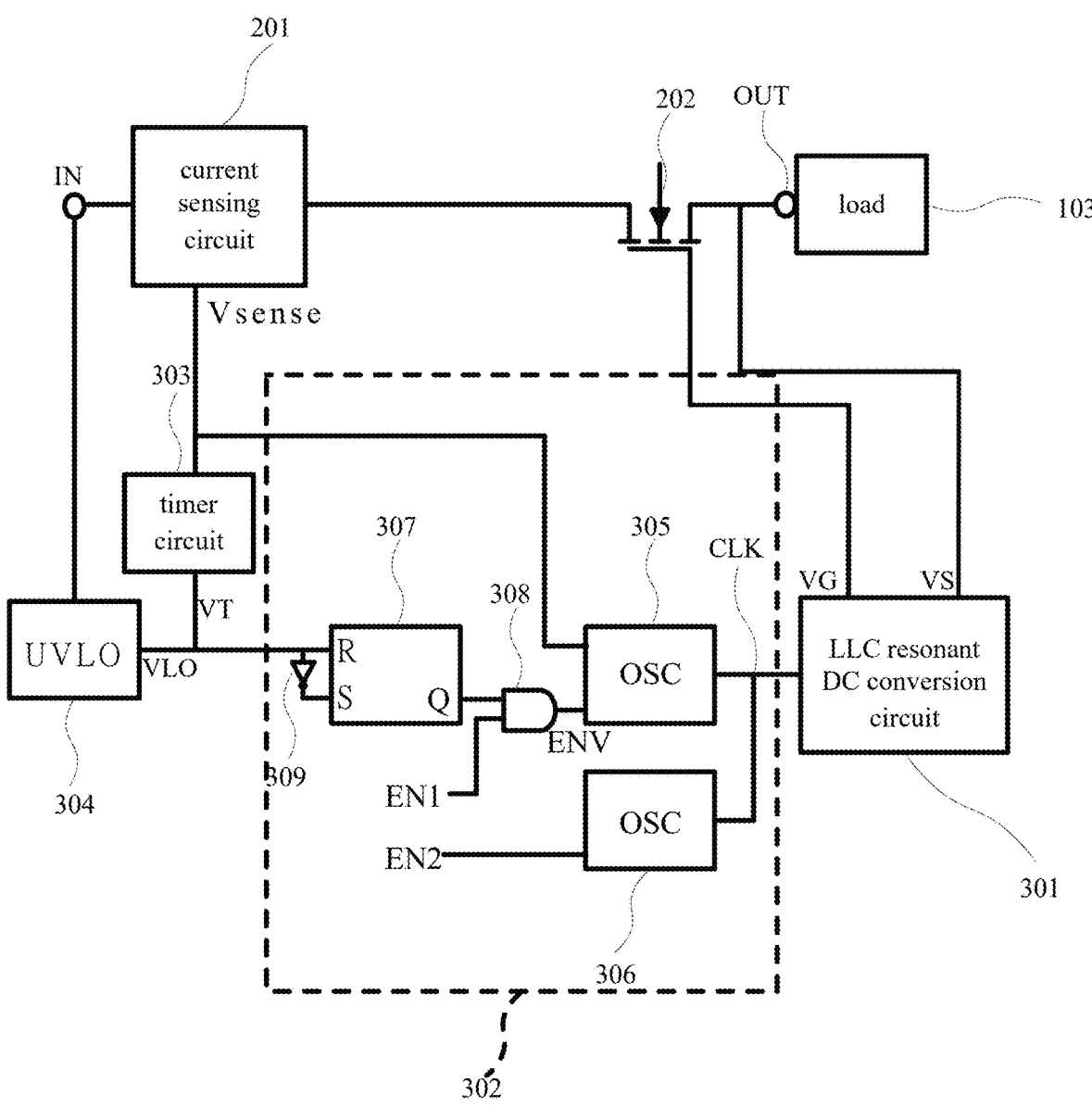
FIG. 3 illustrates a circuit block diagram depicting a transistor switch control circuit 203 according to a preferred embodiment of the present invention.

FIG. 3 illustrates a circuit block diagram depicting a transistor switch control circuit 203 according to a preferred embodiment of the present invention. Referring to FIG. 3, in this embodiment, the transistor switch control circuit 203 includes an LLC resonant DC conversion circuit (LLC DC converter) 301, a relaxation oscillator circuit 302, a timer circuit 303 and an undervoltage lockout (UVLO) circuit 304. In this embodiment, the relaxation oscillator circuit 302 includes a frequency controllable relaxation oscillator (OSC) 305, a start-up oscillator (OSC) 306, a set-reset flip-flop 307, an AND gate 308 and an inverter 309.

Figure 4:
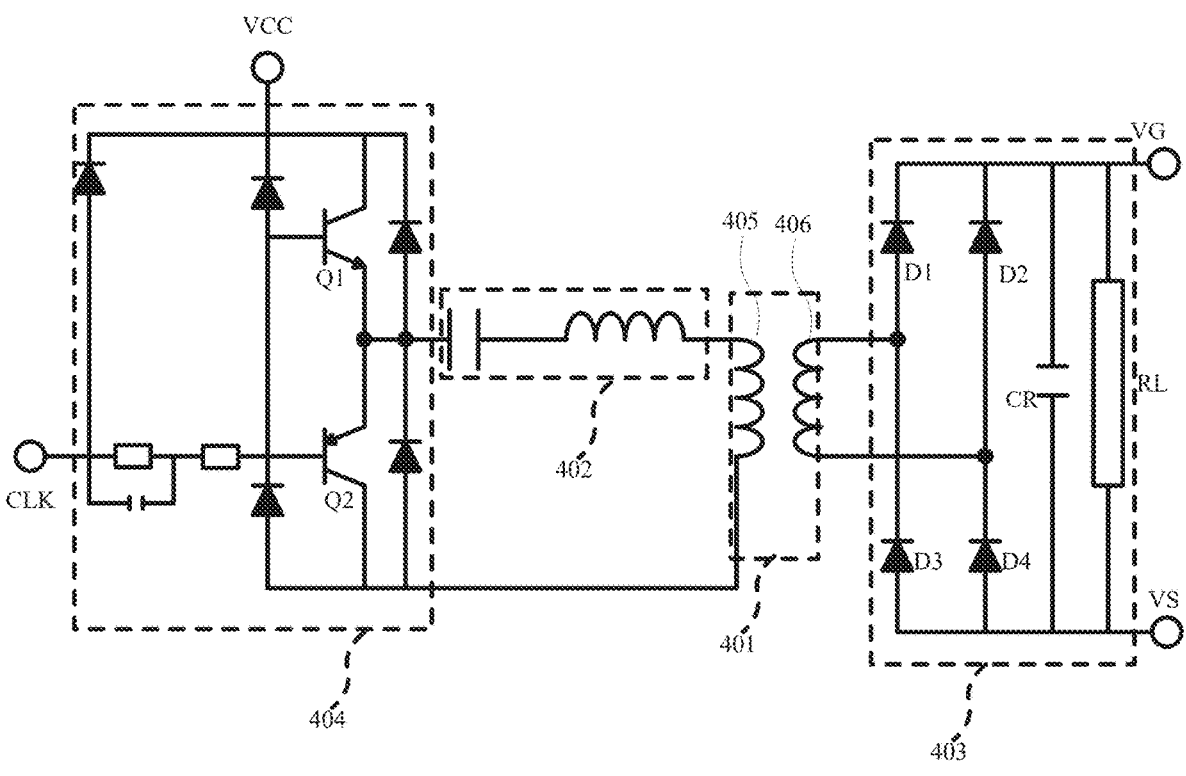
FIG. 4 illustrates a circuit block diagram depicting an LLC resonant DC conversion circuit 301 according to a preferred embodiment of the present invention.

FIG. 4 illustrates a circuit block diagram depicting an LLC resonant DC conversion circuit 301 according to a preferred embodiment of the present invention. Referring to FIG. 4, the LLC resonant DC conversion circuit 301 includes a transformer 401, an LC resonant circuit 402, a rectifier filtering circuit 403 and a switching circuit 404. The transformer 401 includes a primary side coil 405 and a secondary side coil 406. The LC resonant circuit 402 is coupled to the primary side coil 405 of the transformer 401. In this embodiment, the rectifier filtering circuit 403 includes four diodes D1 to D4, a capacitor CR and a resistor RL. The first input terminal of the rectifier filtering circuit 403 is coupled to the first terminal of the secondary side coil 406, the second input terminal of the rectifier filtering circuit 403 is coupled to the second terminal of the secondary side coil 406, and the first output terminal of the rectifier filtering circuit 403 is coupled to the control terminal (gate) VG of the transistor switch circuit (N-type metal oxide semiconductor field effect transistor) 202, the second output terminal of the rectifier filtering circuit 403 is coupled to the second terminal (source) VS of the transistor switch circuit (N-type metal oxide semiconductor field effect transistor) 202.

The switching circuit 404 is implemented by N-type bipolar transistor Q1 and P-type bipolar transistor Q2 and their peripheral circuits. Basically, it is a push-pull circuit, implemented in the form of upper N and lower P. The reason why the upper N and lower P implementation is adopted, is mainly to make the input amplitude and the output amplitude substantially equal, and will not be affected by the supply voltage VCC. Since the input terminal of the switching circuit 404 receives the clock signal CLK sent from the relaxation oscillator circuit 302, the output terminal of the switching circuit 404 is coupled to the LC resonant circuit 402, and the clock signal CLK of the relaxation oscillator circuit 302 can directly control the switching circuit 404, such that the output of the LLC resonant DC conversion circuit 301 is controlled.

This embodiment adopts LLC resonant DC conversion circuit 301, which is a resonant circuit that controls the output voltage by controlling the switching frequency (frequency adjustment). The LLC resonant DC conversion circuit has several advantages: first, the circuit structure is relatively simple and has high efficiency; second, with appropriate circuit design, it can achieve zero voltage turn-on switching (ZVS) of the two main switches on the primary side within the entire operating range and zero-current turn-off (ZCS) of the secondary side rectifier diode so as to improve the efficiency and power density of the power converter; thirdly, The LLC resonant DC conversion circuit can regulate the output under the situation with greater variation of input voltage and load while maintaining relatively small changes in switching frequency; fourth, the LLC resonant DC conversion circuit does not require an output inductor, which can further reduce system costs.

Figure 5:
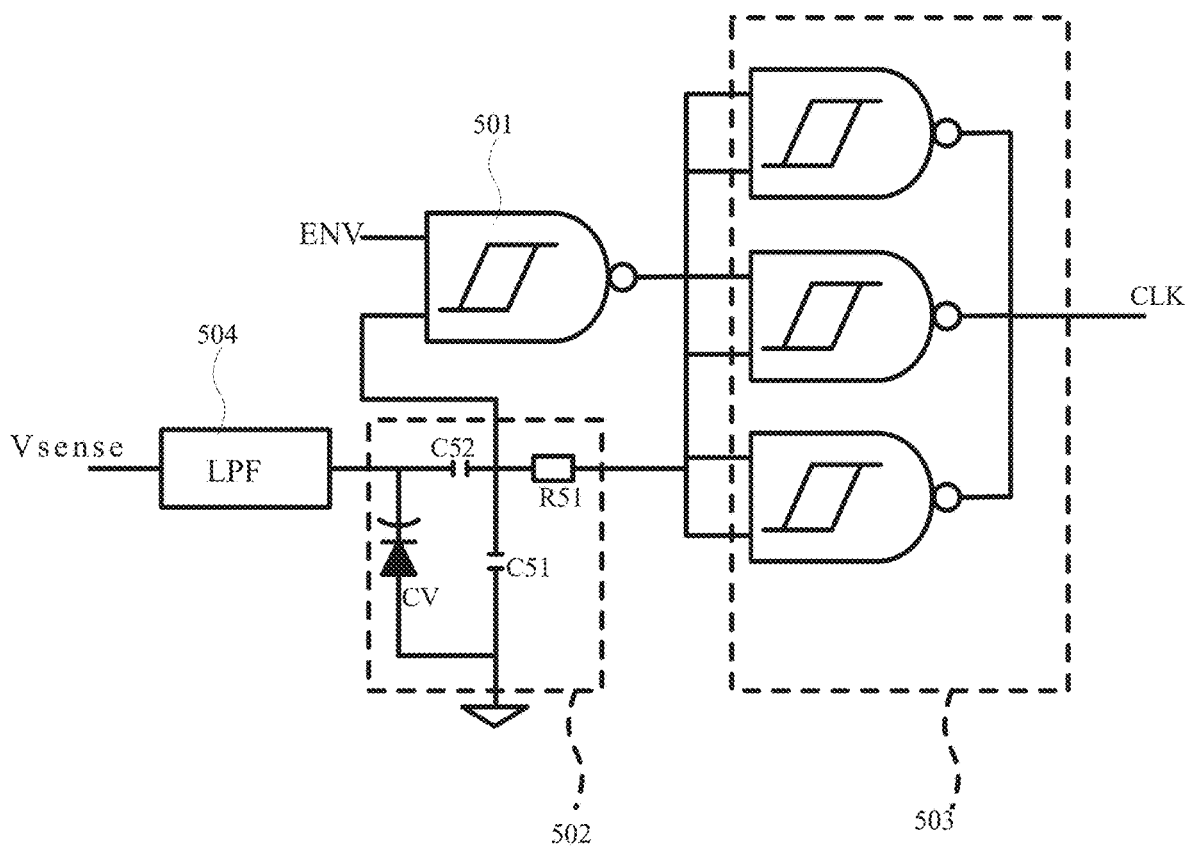
FIG. 5 illustrates a circuit block diagram depicting a frequency controllable relaxation oscillator 305 of the relaxation oscillator circuit 302 according to a preferred embodiment of the present invention.

FIG. 5 illustrates a circuit block diagram depicting a frequency controllable relaxation oscillator 305 of the relaxation oscillator circuit 302 according to a preferred embodiment of the present invention. Referring to FIG. 5, the frequency controllable relaxation oscillator 305 includes a first NAND gate 501, a variable-capacitance circuit 502 and a Schmitt trigger circuit 503. The first input terminal of the first NAND gate 501 receives an activate/deactivate signal ENV, and the second input terminal of the first NAND gate 501 is coupled to the variable-capacitance circuit 502. In this embodiment, the variable-capacitance circuit 502 is implemented by a first resistor R51, a first capacitor C51, a block capacitor C52 and a varactor CV, and their coupling relationship is shown in FIG. 5. A terminal of the varactor CV receives the current sense voltage Vsense output by the current sensing circuit 201, thereby adjusting the capacitance value of the varactor CV. In addition, the varactor CV is electrically connected in parallel with the first capacitor C51 through block capacitor C52.

In order to briefly explain the above circuit operation, it is first assumed that the activate/deactivate signal ENV is in the enable (Enable) state, that is, the state of logic 1. At this time, the variable-capacitance circuit 502 has not been charged and is in the logic 0 state, so the output terminal of the first NAND gate 501 outputs a logic high voltage. At this time, the logic high voltage charges the capacitor implemented by the first capacitor C51, the block capacitor C52 and the varactor CV through first resistor R51. When the charge reaches the trigger point, the output terminal of the first NAND gate 501 outputs a logic low voltage, and the charge in the capacitor implemented by the first capacitor C51, the block capacitor C52 and the varactor CV will be discharged through the first resistor R51, and the operation is repeated. In addition, the current sense voltage Vsense output by the current sensing circuit 201 can be used to change the capacitance value of the varactor CV. In this way, the time constant of the circuit composed of the first capacitor C51, block capacitor C52, varactor CV, and first resistor R51 can be adjusted, whereby the frequency of the clock signal CLK output by the frequency controllable relaxation oscillator 305 can be changed accordingly.

In addition, it is assumed that the activate/deactivate signal ENV is in a disabled state, that is, a logic 0 state, at this time, the output terminal of the first NAND gate 501 can only output a logic high voltage. Therefore, when the equivalent capacitor implemented by the first capacitor C51, the block capacitor C52, and the varactor CV is fully charged, the output voltage of the output terminal of the first NAND gate 501 cannot be changed, so the clock signal CLK cannot be output.

Furthermore, the above-mentioned Schmitt trigger circuit 503 is composed of three Schmitt NAND gates A51, A52, and A53. However, those skilled in the art should know that the Schmitt trigger circuit 503 has various implementations, and may be implemented using amplifiers and resistors or other logic circuits, for example. The present invention is not limited thereto.

Moreover, in the above-mentioned embodiment, a low-pass filter 504 is additionally illustrated. Since the frequency controllable relaxation oscillator 305 controls the frequency through RC charging and discharging, an AC signal will be generated on this circuit. This AC signal may affect the current sense voltage Vsense output by the current sensing circuit 201. Therefore, in this preferred embodiment, a low-pass filter 504 (as shown in FIG. 5) can be added. The low-pass filter 504 effectively blocks the AC signal without affecting the current sense voltage Vsense output from the current sensing circuit 201.

Figure 6:
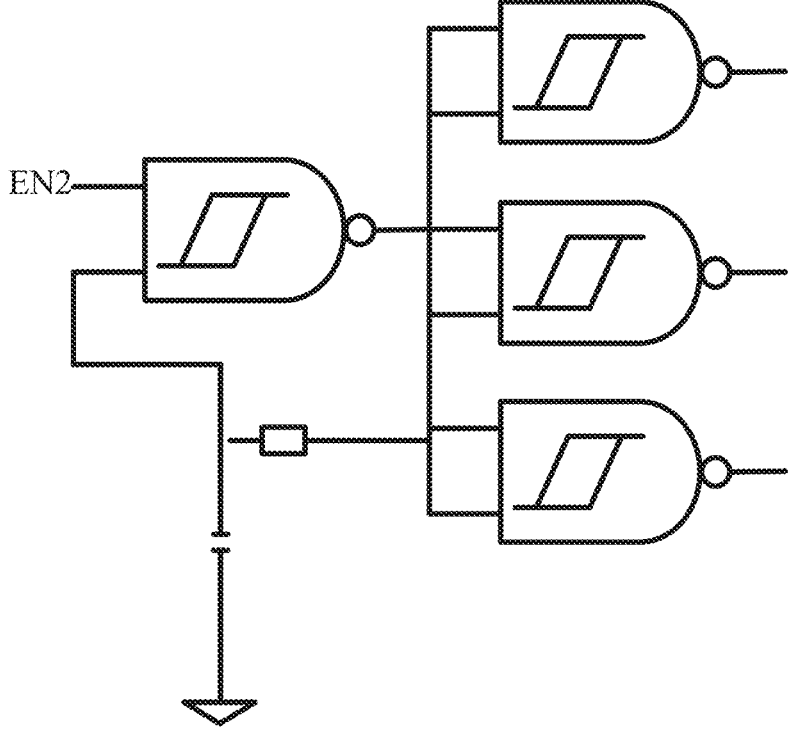
FIG. 6 illustrates a circuit block diagram depicting a start-up oscillator 306 of the relaxation oscillator circuit 302 according to a preferred embodiment of the present invention.

FIG. 6 illustrates a circuit block diagram depicting a start-up oscillator 306 of the relaxation oscillator circuit 302 according to a preferred embodiment of the present invention. Referring to FIG. 6, the circuit structure of this start-up oscillator 306 is similar to the circuit of the above-mentioned frequency controllable relaxation oscillator 305. The difference is that the charge/discharge circuit 601 of this start-up oscillator 306 is implemented by a fixed capacitor C61 and a resistor R61. Therefore, the frequency of the output start-up clock SCLK is determined by the time constant of the capacitor C61 and the resistor R61, which is a fixed frequency.

In this embodiment, the frequency control of the latch current limiter circuit 102 is to change the capacitance of the varactor CV through the current sense voltage Vsense output by the current sensing circuit 201, thereby adjusting the oscillator frequency of the frequency controllable relaxation oscillator 305. When the transistor switch circuit 202 (N-type metal oxide semiconductor field effect transistor) is not turned on, the current sensing circuit 201 does not yet have a voltage output, so a start-up oscillator 306 is added here to be used for start-up the latch current limiter circuit 102. After starting the start-up oscillator 306 by the start-up signal EN2, then the start-up signal EN2 is disabled and the start-up signal EN1 is enabled, the start-up oscillator 306 can be closed and returned to the frequency controllable relaxation oscillator 305 for controlling the latch current limiter circuit 102 to perform current limiting protection.

In the above embodiment, the varactor CV is implemented with a reverse biased varactor diode. When the current from the input terminal IN to the output terminal OUT increases, the current sense voltage Vsense output by the current sensing circuit 201 will also increase, and the capacitance value of the varactor diode will become smaller, so the oscillation frequency of the clock signal CLK will increase. And at the same time, the switching frequency of the switching circuit 404 will increase accordingly. Therefore, when designing the LLC resonant DC conversion circuit 301, it is necessary to design the inductance value, capacitance value of the LC resonant circuit 402 and the magnetizing inductance value, leakage inductance value of the transformer 401, etc., to calculate the resonant frequency and achieve zero voltage switching and increase the efficiency of the LLC resonant DC conversion circuit 301.

Figure 7:
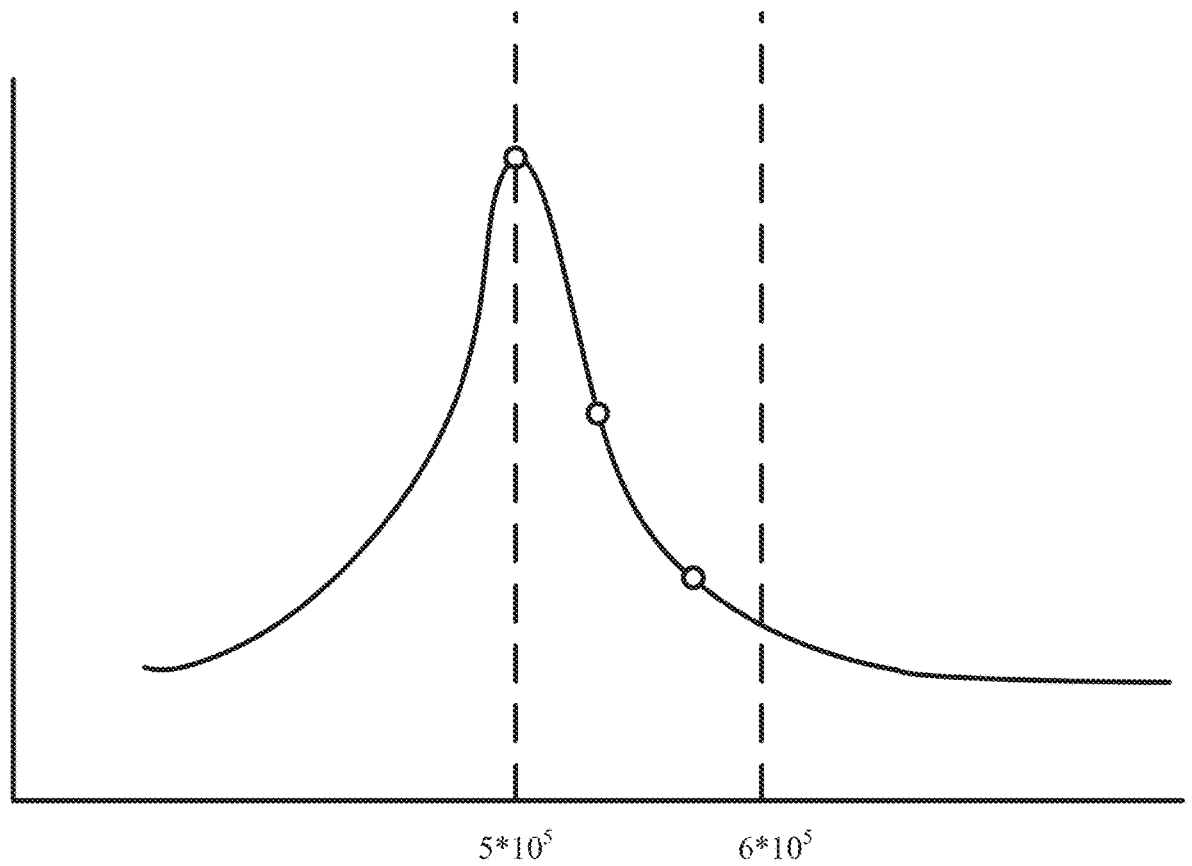
FIG. 7 illustrates a gain curve diagram depicting an LLC resonant DC conversion circuit 301 according to a preferred embodiment of the present invention.

FIG. 7 illustrates a gain curve diagram depicting an LLC resonant DC conversion circuit 301 according to a preferred embodiment of the present invention. Referring to FIG. 7, the switching frequency range of the target is as shown in the curve of FIG. 7, and is changed from the right side to the highest point (the second resonant frequency point) in the figure. Zero voltage switching can be achieved in this area, and the switching loss of the circuit is lower, and the gain change required by the circuit can be met. Therefore, in this embodiment, if the current between the input terminal IN and the output terminal OUT is too large, the current sense voltage Vsense of the current sensing circuit 201 is increased, the oscillator frequency of the frequency controllable relaxation oscillator 305 will increase accordingly, and the operation of the LLC resonant DC conversion circuit 301 will deviate from the resonance point of the highest gain, such that the gain is decreased. Thereby the gate-to-source voltage VGS of the transistor switch circuit 202 (N-type metal oxide semiconductor field effect transistor) is decreased. The transistor switch circuit 202 is entered the impedance region. The impedance of the transistor switch circuit 202 (N-type metal oxide semiconductor field effect transistor) is increased to limit the current.

In addition, in the above embodiment, a timer circuit 303 is also included. Please refer back to FIG. 3. The input terminal of the timer circuit 303 also receives the current sense voltage Vsense output by the current sensing circuit 201. When the current between the input terminal IN and the output terminal OUT is too large, the current sense voltage Vsense of the current sensing circuit 201 is increased. The timer circuit 303 will start timing and continue to operate. If the current has not dropped to the safe area, after the timing is completed, the timer circuit 303 will enable the complete timing signal VT. At this time, the output terminal of set-reset flip-flop 307 will output a logic low voltage. Since the two input terminals of AND gate 308 need to be both logic high voltages, the output terminal of AND gate 308 can maintain logic high voltage, the output terminal of the set-reset flip-flop 307 output logic low voltage will cause AND gate 308 to output logic low voltage. Currently, the activate/deactivate signal ENV of the frequency controllable relaxation oscillator 305 is in the disabled state, that is in the state of logic 0. At this time, the output terminal of the first NAND gate 501 can only output a logic high voltage, and the frequency controllable relaxation oscillator 305 will stop oscillating. In this way, the transistor switch circuit 202 (N-type metal oxide semiconductor field effect transistor) will be forced to cut-off such that the effect of the current limiting protection is achieved.

Figure 8:
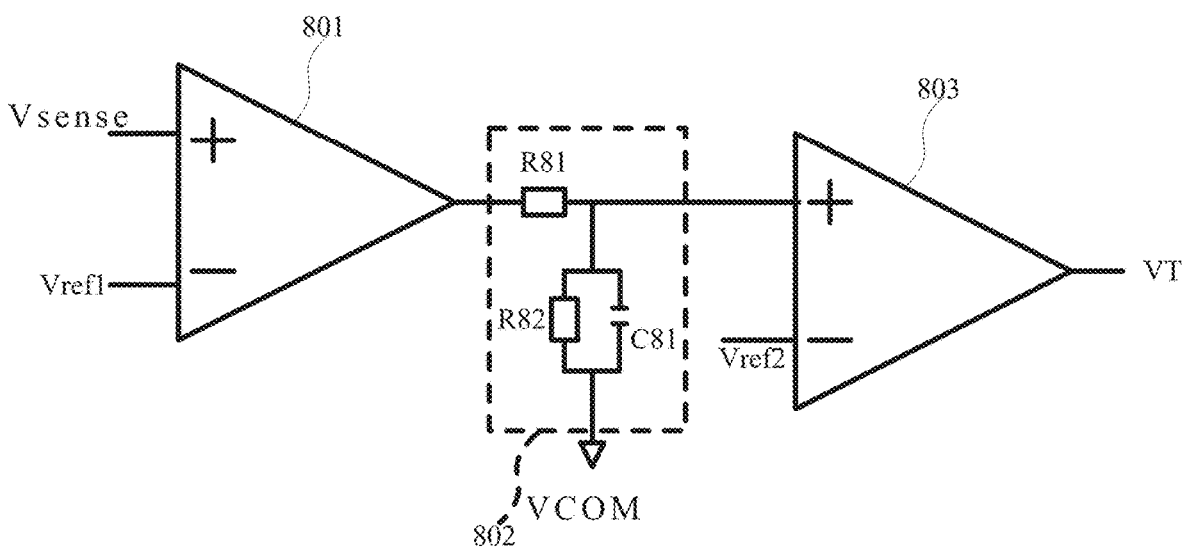
FIG. 8 illustrates a circuit diagram depicting a timer circuit 303 according to a preferred embodiment of the present invention.

FIG. 8 illustrates a circuit diagram depicting a timer circuit 303 according to a preferred embodiment of the present invention. Referring to FIG. 8, in this embodiment, the timer circuit 303 is implemented by a first comparator 801, a charge/discharge circuit 802 and a second comparator 803. The first comparator 801 includes a first input terminal, a second input terminal and an output terminal, wherein the first input terminal of the first comparator 801 is coupled to the input terminal of the timer circuit 303 to receive the current sense voltage Vsense, and the second input terminal of the first comparator 801 receives a first reference voltage Vref1. In this embodiment, the charge/discharge circuit 802 is implemented with two resistors R81 and R82 and a capacitor C81. The first terminal of the resistor R81 is coupled to the output terminal of the first comparator 801, the first terminal of the capacitor C81 is coupled to the second terminal of the resistor R81, and the second terminal of the capacitor C81 is coupled to the common voltage VCOM. The first terminal of the resistor R82 is coupled to the first terminal of the capacitor C81, and the second terminal of the resistor R82 is coupled to the second terminal of the capacitor C81.

The second comparator 803 includes a first input terminal, a second input terminal and an output terminal. The first input terminal of the second comparator 803 is coupled to the first terminal of the capacitor C81, and the second input terminal of the second comparator 803 receives a second reference. voltage Vref2, the output terminal of second comparator 803 outputs complete timing signal VT. When the current between the input terminal IN and the output terminal OUT is too large, the current sense voltage Vsense of the current sensing circuit 201 is increased beyond the first reference voltage Vref1, the first comparator 801 will output a positive saturation voltage and charge capacitor C81 through the first terminal of the resistor R81. If the voltage between both terminals of the capacitor C81 is charged to a value greater than the second reference voltage, the second comparator 803 will change the state of the complete timing signal VT. At this time, the frequency controllable relaxation oscillator 305 will stop operating as described above. In this embodiment, the time counted by the timer circuit 303 is determined by the RC time constant of the charge/discharge circuit 802 of the two resistors R81 and R82 and the capacitor C81.

In the above-mentioned embodiment, the timer circuit 303 does not use a hysteresis comparator like the Schmitt trigger circuit. The Schmitt trigger circuit is to avoid repeated output switching of the comparator. However, in this embodiment, if the hysteresis is added into the first comparator 801 and the second comparator 803 of the timer circuit 303, it may often cause inaccuracy in response time. Therefore, in this embodiment, the hysteresis does not be adopted in the first comparator 801 and the second comparator 803. However, those with ordinary skill in the art should know that if the hysteresis delay has been considered, the Schmitt trigger circuit can also be used to implement the timer circuit 303, so the present invention is not limited thereto.

In addition, in the above-mentioned embodiments, although the timer circuit 303 is implemented as an analog circuit, those with ordinary skill in the art should know that the timer circuit 303 can also be implemented as a digital circuit. Therefore, the present invention is not limited thereto.

Figure 9:
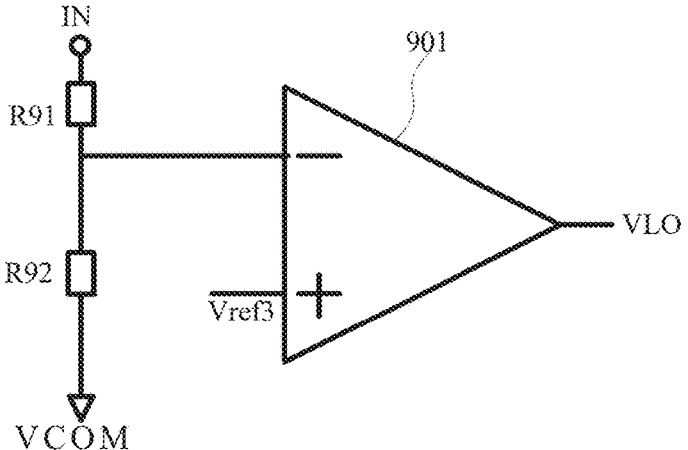
FIG. 9 illustrates a circuit diagram depicting a undervoltage lockout (UVLO) circuit 304 according to a preferred embodiment of the present invention.

FIG. 9 illustrates a circuit diagram depicting a undervoltage lockout (UVLO) circuit 304 according to a preferred embodiment of the present invention. Referring to FIG. 9, the undervoltage lockout (UVLO) circuit 304 includes a comparator 901 and two resistors R91 and R92. The first terminal of the resistor R91 is coupled to the input terminal IN of the latch current limiter circuit 102, the second terminal of the resistor R91 is coupled to the first terminal of the resistor R92, and the second terminal of the resistor R92 is coupled to the common voltage VCOM. The negative input terminal of the comparator 901 is coupled to the second terminal of the resistor R91, and the positive input terminal of the comparator 901 receives a reference voltage Vref3. In this embodiment, after the input voltage is divided by resistors R91 and R92, it is compared with the above-mentioned reference voltage Vref3. If it is less than the reference voltage Vref3, it means that the input voltage is insufficient, and the voltage VLO output by the comparator 901 will change state. When the set-reset flip-flop 307 receives the voltage VLO, the Q terminal of the set-reset flip-flop 307 outputs a logic low voltage. At this time, the frequency controllable relaxation oscillator 305 will stop operating as mentioned above such that the under-voltage lockout protection is achieved.

During designing, the undervoltage protection can be placed at the input terminal IN of the latch current limiter circuit 102 or the output terminal OUT of the latch current limiter circuit 102. However, based on the actual situation of this case, when the current is limited, the transistor switch circuit (N-type metal oxide semiconductor field effect transistor) 202 enters the ohmic zone, the RDS of the transistor switch circuit (N-type metal oxide semiconductor field effect transistor) 202 is increased, which will divide too much voltage drop. As a result, the system will enter the protection due to the above-mentioned undervoltage lockout (UVLO) circuit 304 before the timing of the timer circuit is completed. Therefore, this embodiment configures the undervoltage lockout (UVLO) circuit 304 at the input terminal IN.

However, the present invention does not limit the configuration of the undervoltage lockout (UVLO) circuit 304.

In the above-mentioned embodiment, the current sense voltage Vsense output by the current sensing circuit 201 is designed in a manner proportional to the current, so the above timer circuit 303, the above undervoltage lockout (UVLO) circuit 304, the above frequency controllable relaxation oscillator 305, the above set-reset flip-flop 307 and other circuits are designed according to the above guidelines. However, the current sense voltage Vsense output by the current sensing circuit 201 can also be designed to be inversely proportional to the current. If the current sense voltage Vsense output by the current sensing circuit 201 is inversely proportional to the current, a person with ordinary skill in the art can modify the circuit in different directions according to the circuit provided in the above embodiment. Therefore, without changing the spirit of the invention, the invention is not limited to the circuit of the above preferred embodiment.

Figure 10:
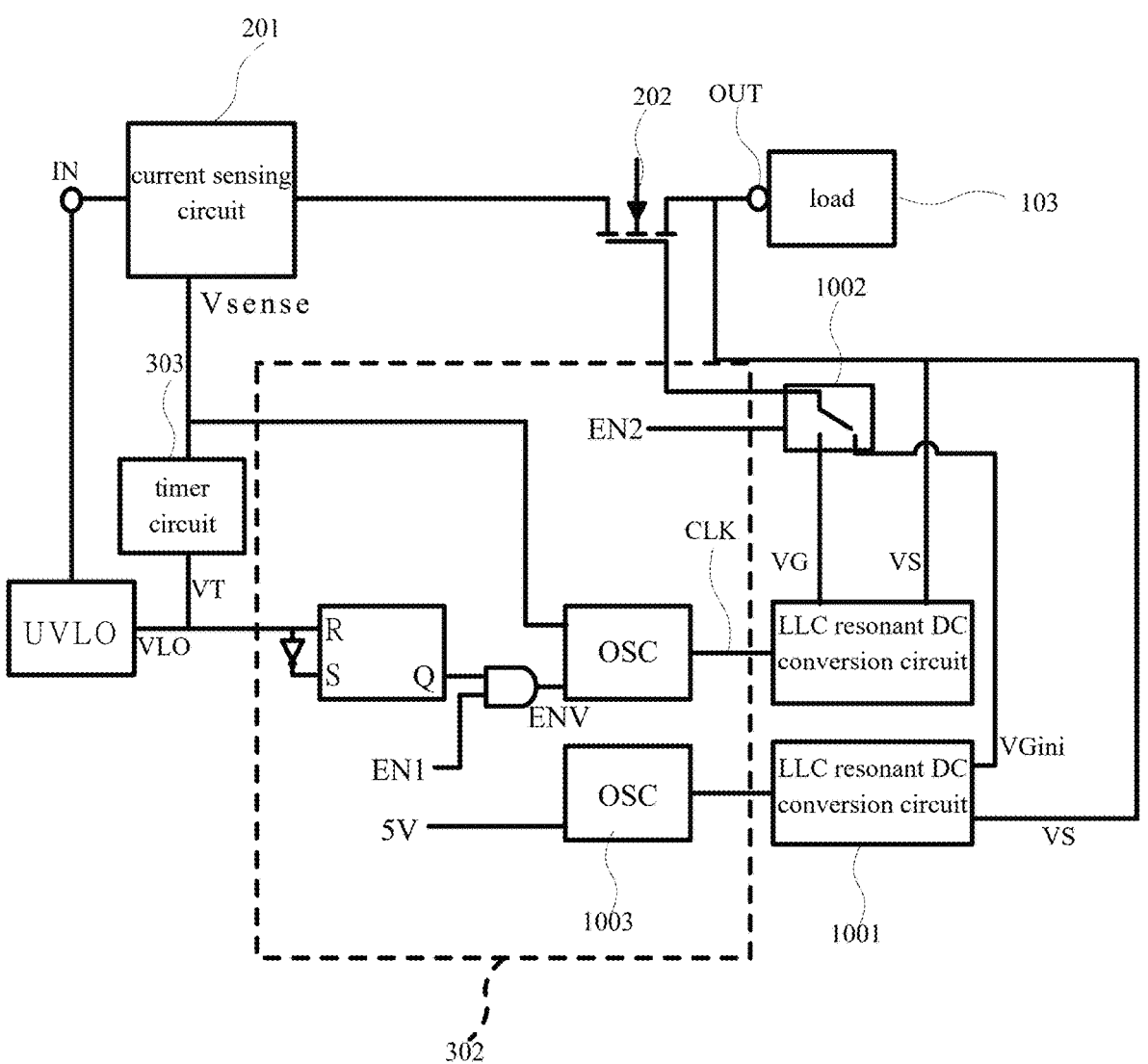
FIG. 10 illustrates a circuit block diagram depicting a transistor switch control circuit 203 according to a preferred embodiment of the present invention.

In the above-mentioned embodiment, when the latch current limiter circuit 102 is designed, when an overcurrent occurs, the transistor switch circuit 202 will first be set in the resistance region to limit the current for a period, and then the transistor switch circuit 202 will be closed. The reason is that in space, when many semiconductor devices are exposed to radiation in the space environment, there is a very low probability of experiencing Single Event Latch-Up (SEL) phenomena. Although SEL is an exceedingly rare occurrence, it can potentially lead to the self-destruction of the device. Therefore, it is crucial to mitigate such events, providing an opportunity for reactivation to ensure the circuit's overall reliability and operational lifespan. In addition, although the above-mentioned embodiment uses the "resonant point with the highest gain" as an example, those with ordinary skill in the art should know that that circuits generally have inherent tolerances. When implementing practical circuits, deviations may occur. It is also understood by those skilled in the art that operation near the resonance point is enough, and precise alignment with the resonance point is not strictly necessary. Therefore, the present invention is not limited by the requirement for exact alignment with the resonance point FIG. 10 illustrates a circuit block diagram depicting a transistor switch control circuit 203 according to a preferred embodiment of the present invention. Referring to FIG. 10 and FIG. 3, the difference between the circuit in FIG. 10 and the circuit in FIG. 3 is that an additional LLC resonant DC conversion circuit 1001 and a switching circuit 1002 are added. In addition, the start-up oscillator 306 that originally received the start-up signal EN2 is changed to receive the 5V DC voltage oscillator circuit 1003, and the switching circuit 1002 receives the above-mentioned start-up signal EN2. When the operation begins, the start-up signal EN2 is enabled, causing the LLC resonant DC conversion circuit 1001 to initiate operation and output an initial gate voltage VGini. The switching circuit 1002 switches to the LLC resonant DC conversion circuit 1001, enabling the transistor switch circuit 202. Subsequently, when the LLC resonant DC conversion circuit 301 stabilizes in operation, the mentioned start-up signal EN2 is disabled, allowing the LLC resonant DC conversion circuit 301 to take control of the transistor switch circuit 202. The switching circuit 1002, for example, can be implemented by a relay. The present invention is not limited thereto. In addition, the above-mentioned embodiment only provides another preferred implementation means, and the present invention is not limited thereto. The above-mentioned oscillator circuit 1003 can also adopt the circuit structure depicting in FIG. 6, for example. The only difference is that it originally receives the start-up signal EN2 and instead receives the 5V voltage. Since the operating principle of the oscillator circuit 1003 has been mentioned in the above embodiment, the detail description is omitted.

In summary, the preferred embodiments of the present invention, within the spacecraft power system, incorporate a semiconductor switching circuit placed between the power supply terminal and power receiving terminal. Additionally, the control of the semiconductor switching circuit is achieved through a resonant-type power supply unit. In the event of an overcurrent, the operating frequency of the resonant-type power supply unit is deliberately shifted away from the resonance point. This deviation will result in semiconductor switching circuit transforming into a resistive mode, thereby limiting the excessive current flow. After a predetermined time, the semiconductor switching circuit is then deactivated. This approach provides an opportunity for temporarily faulted loads to be reactivated.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation to encompass all such modifications.

What is claimed is:

1. A latch current limiter circuit, adapted for spacecraft power system, comprising:

an input terminal;

an output terminal;

a current sensing circuit, coupled between the input terminal and the output terminal, for outputting a current sense voltage according to the current flowing from the input terminal to the output terminal;

a transistor switch circuit, comprising a first terminal, a second terminal and a control terminal, wherein the first terminal of the transistor switch circuit is coupled to the input terminal through a current sensing circuit, and the second terminal of the transistor switch circuit is coupled to the output terminal; and a transistor switch control circuit, comprising:

a transformer, comprising a primary side coil and a secondary side coil;

an LC resonant circuit, coupled to the primary side coil of the transformer;

a rectifier filtering circuit, comprising a first input terminal, a second input terminal, a first output terminal and a second output terminal, wherein the first input terminal of the rectifier filtering circuit is coupled to a first terminal of the secondary side coil, the second input terminal of the rectifier filtering circuit is coupled to a second terminal of the secondary side coil, the first output terminal of the rectifier filtering circuit is coupled to the control terminal of the transistor switch circuit, and the second output terminal of the rectifier filtering circuit is coupled to the second terminal of the transistor switch circuit;

a switching circuit, comprising an input terminal and an output terminal, wherein the output terminal of the switching circuit is coupled to the LC resonant circuit; and a relaxation oscillator circuit, receiving the current sense voltage, outputting a clock signal to the input terminal of the switching circuit, for controlling the switching circuit, so as to control an output voltage of the transistor switch control circuit, such that an operation mode of the transistor switch circuit is controlled, wherein the relaxation oscillator circuit comprises a variable-capacitance circuit for changing the capacitance value of the variable-capacitance circuit according to the current sense voltage, wherein the relaxation oscillator circuit is for changing a frequency of the clock signal output from the relaxation oscillator circuit according to the capacitance value of the variable-capacitance circuit, and wherein, when the current flowing from the input terminal to the output terminal is greater than a preset value, the current sense voltage is changed so as to change the capacitance value of the variable-capacitance circuit, and the frequency of the clock signal is changed such that an operation of the transistor switch control circuit deviates from a resonance point, thereby reducing the output voltage of the transistor switch control circuit, causing the transistor switch circuit to operate in a resistance mode to limit the current from the input terminal to the output terminal.

2. The latch current limiter circuit according to claim 1, wherein the relaxation oscillator circuit comprises:

a first NAND gate, comprising a first input terminal, a second input terminal and an output terminal, wherein the first input terminal of the first NAND gate receives an activate/deactivate signal, and the second input terminal of the first NAND gate is coupled to the variable-capacitance circuit;

a Schmitt trigger circuit, comprising an input terminal and an output terminal, wherein the input terminal of the Schmitt trigger circuit is coupled to the output terminal of the first NAND gate, and the output terminal of the Schmitt trigger circuit outputs the clock signal;

wherein the variable-capacitance circuit comprises:

a first resistor, comprising a first terminal and a second terminal, wherein the first terminal of the first resistor is coupled to the output terminal of the first NAND gate, the second terminal of the first resistor is coupled to the second input terminal of the first NAND gate;

a first capacitor, comprising a first terminal and a second terminal, wherein the first terminal of the first capacitor is coupled to the second input terminal of the first NAND gate, the second terminal of the first capacitor is coupled to the common voltage;

a block capacitor, comprising a first terminal and a second terminal, wherein the first terminal of the block capacitor is coupled to the second input terminal of the first NAND gate; and a varactor, comprising a first terminal and a second terminal, wherein the first terminal of the varactor is coupled to the second terminal of the block capacitor, and the second terminal of the varactor is coupled to the common voltage, and wherein the first terminal of the varactor receives the current sense voltage to adjust a capacitance value of the varactor.

3. The latch current limiter circuit according to claim 2, wherein the relaxation oscillator circuit further comprises:

a timer circuit, comprising an input terminal and an output terminal, wherein the input terminal of the timer circuit receives the current sense voltage, wherein a timing of the timer circuit starts, when the current sense voltage reaches a predetermined voltage, and a complete timing signal output by the timer circuit is enabled when the timer circuit starts timing a predetermined time;

a set-reset flip-flop, comprising a reset input terminal, a set input terminal and a Q output terminal, wherein the reset input terminal of the set-reset flip-flop receives the complete timing signal from the output terminal of the timer circuit, and the Q output terminal of the set-reset flip-flop outputs a latch signal;

an inverter, comprising an input terminal and an output terminal, wherein the input terminal of the inverter is coupled to the reset input terminal of the set-reset flip-flop, the output terminal of the inverter is coupled to the set input terminal of the set-reset flip-flop; and an AND gate, comprising a first input terminal, a second input terminal and an output terminal, wherein the first input terminal of the AND gate is coupled to the Q output terminal of the set-reset flip-flop to receives the latch signal, the second input terminal of the AND gate receives a start-up signal, and the output terminal of the AND gate outputs the activate/deactivate signal.

4. The latch current limiter circuit according to claim 3, further comprising:

a undervoltage lockout (UVLO) circuit, comprising an input terminal and an output terminal, wherein the input terminal of the undervoltage lockout circuit is coupled to the input terminal of the latch current limiter circuit, the output terminal of the undervoltage lockout circuit is coupled to the reset input terminal of the set-reset flip-flop, wherein the undervoltage lockout circuit is for detecting a voltage of the input terminal of the latch current limiter circuit, wherein the undervoltage lockout circuit enable an UVLO signal when the voltage of the input terminal of the latch current limiter circuit is lower than an operational voltage.

5. The latch current limiter circuit according to claim 3, wherein the timer circuit further comprises:

a first comparator, comprising a first input terminal, a second input terminal and an output terminal, wherein the first input terminal of the first comparator is coupled to the input terminal of the timer circuit to receive the current sense voltage, the second input terminal of the first comparator recoveries a first reference voltage;

a charge/discharge circuit, comprising an input terminal and an output terminal, wherein the input terminal of the charge/discharge circuit is coupled to the output terminal of the first comparator; and a second comparator, comprising a first input terminal, a second input terminal and an output terminal, wherein the first input terminal of the second comparator is coupled to the output terminal of the charge/discharge circuit, the second input terminal of the second comparator receives a second reference voltage, and the output terminal of the second comparator outputs the complete timing signal.

6. The latch current limiter circuit according to claim 5, wherein the charge/discharge circuit further comprises:

a first resistor, comprising a first terminal and a second terminal, wherein the first terminal of the first resistor is coupled to the input terminal of the charge/discharge circuit;

a second resistor, comprising a first terminal and a second terminal, wherein the first terminal of the second resistor is coupled to the second terminal of the first resistor, and the second terminal of the second resistor is coupled to the common voltage; and a second capacitor, comprising a first terminal and a second terminal, wherein the first terminal of the second capacitor is coupled to the second terminal of the first resistor, and the second terminal of the second capacitor is coupled to the common voltage.

7. The latch current limiter circuit according to claim 1, further comprising:

a start-up oscillator, for initially outputting the clock signal to control the switching circuit in order to start the transistor switch control circuit.

8. The latch current limiter circuit according to claim 1, wherein the rectifier filtering circuit comprises:

a first diode, comprising an anode terminal and a cathode terminal, wherein the anode terminal of the first diode is coupled to the first input terminal of the rectifier filtering circuit, the cathode terminal of the first diode is coupled to the first output terminal of the rectifier filtering circuit;

a second diode, comprising an anode terminal and a cathode terminal, wherein the anode terminal of the second diode is coupled to the second input terminal of the rectifier filtering circuit, and the cathode terminal of the second diode is coupled to the first output terminal of the rectifier filtering circuit;

a third diode, comprising an anode terminal and a cathode terminal, wherein the anode terminal of the third diode is coupled to the second output terminal of the rectifier filtering circuit, and the cathode terminal of the third diode is coupled to the first input terminal of the rectifier filtering circuit; and a fourth diode, comprising an anode terminal and a cathode terminal, wherein the anode terminal of the fourth diode is coupled to the second output terminal of the rectifier filtering circuit, and the cathode terminal of the fourth diode is coupled to the second input terminal of the rectifier filtering circuit.

9. The latch current limiter circuit according to claim 1, wherein the switching circuit comprises:

a first transistor, comprising a base terminal, an emitter terminal and a collector terminal, wherein the base terminal of the first transistor is coupled to the input terminal of the switching circuit to receive the clock signal, the collector terminal of the first transistor receives a power voltage, and the emitter terminal of the first transistor is coupled to the output terminal of the switching circuit; and a second transistor, comprising a base terminal, an emitter terminal and a collector terminal, wherein the base terminal of the second transistor receives the clock signal, the emitter terminal of the second transistor is coupled to the emitter terminal of the first transistor and the output terminal of the switching circuit, and the collector terminal of the second transistor is coupled to a common voltage.

10. The latch current limiter circuit according to claim 1, wherein the LC resonant circuit further comprises:

a resonant capacitor, comprising a first terminal and a second terminal, wherein the first terminal of the resonant capacitor is coupled to the output terminal of the switching circuit; and a resonant inductor, comprising a first terminal and a second terminal, wherein the first terminal of the resonant inductor is coupled to the second terminal of the resonant capacitor, and the second terminal of the resonant inductor is coupled to the primary side coil of the transformer.

11. A spacecraft power system, for providing at least an operational power voltage of an aerospace equipment, wherein the spacecraft power system comprises:

a power supply unit, comprising a power output terminal for providing the operational power voltage; and a latch current limiter circuit, comprising:

an input terminal, coupled to the output terminal of the power supply unit;

an output terminal;

a current sensing circuit, coupled between the input terminal and the output terminal, for outputting a current sense voltage according to the current flowing from the input terminal to the output terminal;

a transistor switch circuit, comprising a first terminal, a second terminal and a control terminal, wherein the first terminal of the transistor switch circuit is coupled to the input terminal through a current sensing circuit, and the second terminal of the transistor switch circuit is coupled to the output terminal;

a transistor switch control circuit, comprising:

a transformer, comprising a primary side coil and a secondary side coil;

an LC resonant circuit, coupled to the primary side coil of the transformer; and a rectifier filtering circuit, comprising a first input terminal, a second input terminal, a first output terminal and a second output terminal, wherein the first input terminal of the rectifier filtering circuit is coupled to a first terminal of the secondary side coil, the second input terminal of the rectifier filtering circuit is coupled to a second terminal of the secondary side coil, the first output terminal of the rectifier filtering circuit is coupled to the control terminal of the transistor switch circuit, and the second output terminal of the rectifier filtering circuit is coupled to the second terminal of the transistor switch circuit;

a switching circuit, comprising an input terminal and an output terminal, wherein the output terminal of the switching circuit is coupled to the LC resonant circuit; and a relaxation oscillator circuit, receiving the current sense voltage, outputting a clock signal to the input terminal of the switching circuit, for controlling the switching circuit, to control an output voltage of the transistor switch control circuit, such that an operation mode of the transistor switch circuit is controlled, wherein the relaxation oscillator circuit comprises a variable-capacitance circuit for changing the capacitance value of the variable-capacitance circuit according to the current sense voltage, wherein the relaxation oscillator circuit is for changing a frequency of the clock signal output from the relaxation oscillator circuit according to the capacitance value of the variable-capacitance circuit, and wherein, when the current flowing from the input terminal to the output terminal is greater than a preset value, the current sense voltage is changed so as to change the capacitance value of the variable-capacitance circuit, and the frequency of the clock signal is changed such that an operation of the transistor switch control circuit deviates from a resonance point, thereby reducing the output voltage of the transistor switch control circuit, causing the transistor switch circuit to operate in a resistance mode to limit the current from the input terminal to the output terminal.

12. The spacecraft power system according to claim 11, wherein the relaxation oscillator circuit further comprises:

a first NAND gate, comprising a first input terminal, a second input terminal and an output terminal, wherein the first input terminal of the first NAND gate receives an activate/deactivate signal, and the second input terminal of the first NAND gate is coupled to the variable-capacitance circuit; and a Schmitt trigger circuit, comprising an input terminal and an output terminal, wherein the input terminal of the Schmitt trigger circuit is coupled to the output terminal of the first NAND gate, and the output terminal of the Schmitt trigger circuit outputs the clock signal;

wherein the variable-capacitance circuit comprises:

a first resistor, comprising a first terminal and a second terminal, wherein the first terminal of the first resistor is coupled to the output terminal of the first NAND gate, the second terminal of the first resistor is coupled to the second input terminal of the first NAND gat;

a first capacitor, comprising a first terminal and a second terminal, wherein the first terminal of the first capacitor is coupled to the second input terminal of the first NAND gate, the second terminal of the first capacitor is coupled to the common voltage;

a block capacitor, comprising a first terminal and a second terminal, wherein the first terminal of the block capacitor is coupled to the second input terminal of the first NAND gate; and a varactor, comprising a first terminal and a second terminal, wherein the first terminal of the varactor is coupled to the second terminal of the block capacitor, and the second terminal of the varactor is coupled to the common voltage, and wherein the first terminal of the varactor receives the current sense voltage to adjust a capacitance value of the varactor.

13. The spacecraft power system according to claim 12, wherein the relaxation oscillator circuit further comprises:

a timer circuit, comprising an input terminal and an output terminal, wherein the input terminal of the timer circuit receives the current sense voltage, wherein a timing of the timer circuit starts, when the current sense voltage reaches a predetermined voltage, and a complete timing signal output by the timer circuit is enabled when the timer circuit starts timing a predetermined time;

a set-reset flip-flop, comprising a reset input terminal, a set input terminal and a Q output terminal, wherein the reset input terminal of the set-reset flip-flop receives the complete timing signal from the output terminal of the timer circuit, and the Q output terminal of the set-reset flip-flop outputs a latch signal;

an inverter, comprising an input terminal and an output terminal, wherein the input terminal of the inverter is coupled to the reset input terminal of the set-reset flip-flop, the output terminal of the inverter is coupled to the set input terminal of the set-reset flip-flop; and an AND gate, comprising a first input terminal, a second input terminal and an output terminal, wherein the first input terminal of the AND gate is coupled to the Q output terminal of the set-reset flip-flop to receives the latch signal, the second input terminal of the AND gate receives a start-up signal, and the output terminal of the AND gate outputs the activate/deactivate signal.

14. The spacecraft power system according to claim 13, wherein the latch current limiter circuit further comprises:

a undervoltage lockout (UVLO) circuit, comprising an input terminal and an output terminal, wherein the input terminal of the undervoltage lockout circuit is coupled to the input terminal of the latch current limiter circuit, the output terminal of the undervoltage lockout circuit is coupled to the reset input terminal of the set-reset flip-flop, wherein the undervoltage lockout circuit is for detecting a voltage of the input terminal of the latch current limiter circuit, wherein the undervoltage lockout circuit enable an UVLO signal when the voltage of the input terminal of the latch current limiter circuit is lower than an operational voltage.

15. The spacecraft power system according to claim 13, wherein the timer circuit further comprises:

a first comparator, comprising a first input terminal, a second input terminal and an output terminal, wherein the first input terminal of the first comparator is coupled to the input terminal of the timer circuit to receive the current sense voltage, the second input terminal of the first comparator recoveries a first reference voltage;

a charge/discharge circuit, comprising an input terminal and an output terminal, wherein the input terminal of the charge/discharge circuit is coupled to the output terminal of the first comparator; and a second comparator, comprising a first input terminal, a second input terminal and an output terminal, wherein the first input terminal of the second comparator is coupled to the output terminal of the charge/discharge circuit, the second input terminal of the second comparator receives a second reference voltage, and the output terminal of the second comparator outputs the complete timing signal.

16. The spacecraft power system according to claim 15, wherein the timer circuit further comprises:

a first resistor, comprising a first terminal and a second terminal, wherein the first terminal of the first resistor is coupled to the input terminal of the charge/discharge circuit;

a second resistor, comprising a first terminal and a second terminal, wherein the first terminal of the second resistor is coupled to the second terminal of the first resistor, and the second terminal of the second resistor is coupled to the common voltage; and a second capacitor, comprising a first terminal and a second terminal, wherein the first terminal of the second capacitor is coupled to the second terminal of the first resistor, and the second terminal of the second capacitor is coupled to the common voltage.

17. The spacecraft power system according to claim 11, wherein the latch current limiter circuit further comprises:

a start-up oscillator, for initially outputting the clock signal to control the switching circuit in order to start the transistor switch control circuit.

18. The spacecraft power system according to claim 11, wherein the rectifier filtering circuit further comprises:

a first diode, comprising an anode terminal and a cathode terminal, wherein the anode terminal of the first diode is coupled to the first input terminal of the rectifier filtering circuit, the cathode terminal of the first diode is coupled to the first output terminal of the rectifier filtering circuit;

a second diode, comprising an anode terminal and a cathode terminal, wherein the anode terminal of the second diode is coupled to the second input terminal of the rectifier filtering circuit, and the cathode terminal of the second diode is coupled to the first output terminal of the rectifier filtering circuit;

a third diode, comprising an anode terminal and a cathode terminal, wherein the anode terminal of the third diode is coupled to the second output terminal of the rectifier filtering circuit, and the cathode terminal of the third diode is coupled to the first input terminal of the rectifier filtering circuit; and a fourth diode, comprising an anode terminal and a cathode terminal, wherein the anode terminal of the fourth diode is coupled to the second output terminal of the rectifier filtering circuit, and the cathode terminal of the fourth diode is coupled to the second input terminal of the rectifier filtering circuit.

19. The spacecraft power system according to claim 11, wherein the switching circuit further comprises:

a first transistor, comprising a base terminal, a emitter terminal and a collector terminal, wherein the base terminal of the first transistor is coupled to the input terminal of the switching circuit to receive the clock signal, the collector terminal of the first transistor receives a power voltage, and the emitter terminal of the first transistor is coupled to the output terminal of the switching circuit; and a second transistor, comprising a base terminal, a emitter terminal and a collector terminal, wherein the base terminal of the second transistor receives the clock signal, the emitter terminal of the second transistor is coupled to the emitter terminal of the first transistor and the output terminal of the switching circuit, and the collector terminal of the second transistor is coupled to a common voltage.

20. The spacecraft power system according to claim 11, wherein the LC resonant circuit further comprises:

a resonant capacitor, comprising a first terminal and a second terminal, wherein the first terminal of the resonant capacitor is coupled to the output terminal of the switching circuit; and a resonant inductor, comprising a first terminal and a second terminal, wherein the first terminal of the resonant inductor is coupled to the second terminal of the resonant capacitor, and the second terminal of the resonant inductor is coupled to the primary side coil of the transformer.

* * * * *